United States Patent [19]

Otsuki et al.

[11] Patent Number: 5,606,183

[45] Date of Patent: *Feb. 25, 1997

[54] DOUBLE-GATED TURN-OFF THYRISTOR

[75] Inventors: Masahito Otsuki; Katsunori Ueno, both of Kawasaki, Japan

[73] Assignee: Fuji Electric Co., Ltd., Kanagawa, Japan

[*] Notice: The term of this patent shall not extend beyond the expiration date of Pat. No. 5,397,905.

[21] Appl. No.: 352,956

[22] Filed: Dec. 9, 1994

Related U.S. Application Data

[63] Continuation-in-part of Ser. No. 218,200, Mar. 28, 1994, which is a continuation of Ser. No. 96,978, Jul. 27, 1993, abandoned.

[30] Foreign Application Priority Data

Dec. 10, 1993 [JP] Japan ................................. 5-309964

[51] Int. Cl.⁶ ......................... H01L 29/74; H01L 31/111
[52] U.S. Cl. ........................ 257/133; 257/139; 257/147; 257/155
[58] Field of Search ........................... 257/132, 133, 257/138, 139, 140, 146, 147, 155, 212, 378

[56] References Cited

U.S. PATENT DOCUMENTS 4,760,431  7/1988  Nakagawa et al. .................... 257/138
5,397,905  3/1995  Otsuki et al. ......................... 257/133

OTHER PUBLICATIONS

M. Stoisiek et al., "MOS GTO –A Turn Off Thyristor With MOS–Controlled Emitter Shorts", IEDM 85 (1985) pp. 158–161.

*Primary Examiner*—Steven H. Loke
*Attorney, Agent, or Firm*—Finnegan, Henderson, Farabow, Garrett & Dunner, L.L.P.

[57] ABSTRACT

A semiconductor device having a thyristor structure including a first semiconductor region of a first conductivity type, a second semiconductor region of a second conductivity type, a third semiconductor region of the first conductivity type and a fourth semiconductor region of the second conductivity type; a first MISFET capable of injecting majority carriers from the fourth semiconductor region into the second semiconductor region; and a second MISFET capable of being turned on and off independently of the first MISFET and extracting majority carriers from the third semiconductor region into the fourth semiconductor region, wherein the fourth semiconductor region is divided into the source region of the first MISFET and the source region of the second MISFET, the latter being formed in a portion isolated from the former, characterized in that the depth of the source region of the second MISFET is different from that of the drain region thereof.

3 Claims, 4 Drawing Sheets

DOUBLE-GATED TURN-OFF THYRISTOR

This is a continuation-in-part of application Ser. No. 08/218,200 filed on Mar. 28, 1994, now pending, which is a continuation of Ser. No. 08/096,978 filed on Jul. 27, 1993, now abandoned.

BACKGROUND OF THE INVENTION

The present invention relates to a semiconductor device having a thyristor structure comprising four layers alternately different in conductivity types and further having two MISFETs for turning on/off purposes.

The parent U.S. patent application Ser. No. 08/218,200 discloses a semiconductor device having a thyristor structure comprising a first semiconductor region of a first conductivity type, a second semiconductor region of a second conductivity type, a third semiconductor region of the first conductivity type and a fourth semiconductor region of the second conductivity type, and further having a first MISFET for making majority carriers injectable into the second semiconductor region and a second MISFET capable of being turned on and off independently of the first MISFET and of extracting the majority carriers from the third semiconductor region, the fourth semiconductor region being divided into the source region of the first MISFET, and the source region of the second MISFET formed in a portion isolated from the source region of the first MISFET.

More specifically, as shown in FIG. 2, a $p^+$-type (first conductivity type) semiconductor substrate provided with a collector electrode (anode electrode) 1 on its undersurface, is a collector layer (first semiconductor region) 2, and an $n^-$-type (second conductivity type) base layer (second semiconductor region) 3 is epitaxially grown on the collector layer 2. In this case, an $n^+$-type buffer layer may be provided between the collector layer 2 and the base layer 3. Moreover, a base layer (third semiconductor region) 4 in the form of a p-type well is formed by diffusion on the surface of the $n^-$-type base layer 3. Further, a first emitter layer 51, a second emitter layer 52 and a drain layer 6, all of which are independent of each other and in the form of an $n^{30}$-type well, are formed on the inside surface of the p-type base layer 4. Of these layers, the $n^{30}$-type emitter layers 51 and 52 in a fourth semiconductor region are mutually connected via emitter electrodes 71 and 72, and a short-circuiting electrode 8 is straddlingly connected to the p-type base layer 4 and the $n^+$-type drain layer 6. Further, a first gate electrode 10 of polycrystal silicon forming a first MOSFET 12 is installed via a gate oxide film 9 over the surface extending from the first $n^{30}$-type emitter layer 51 to the p-type base layer 4 and further to the $n^-$-type base layer 3. On the other hand, a second gate electrode 11 of polycrystal silicon forming a second MOSFET 13 is installed via the gate oxide film 9 over the surface extending from the $n^{30}$-type drain layer 6 to the p-type base layer 4 and further to the second $n^{30}$-type emitter layer 52. The first and second gate electrodes 10 and 11 are made separately controllable. The first and second MOSFETs 12 and 13 are n-channel MOSFETs.

FIG. 3 shows an equivalent circuit of the semiconductor device of FIG. 2. In this device, the first $n^{30}$-type emitter layer 52, the p-type base layer 4 and the $n^{31}$-type base layer 3 constitute an npn-type transistor $Q_{npn1}$, the second $n^{30}$-type emitter layer 51, the p-type base layer 4 and the $n^-$-type base layer 3 constitute an npn-type transistor $Q_{npn2}$. Further, the p-type base layer 4, $n^-$-type base layer 3 and the p+ collector layer 2 constitute an pnp-type transistor $Q_{pnp}$. Consequently, the thyristor structure is formed with these transistors $Q_{npn1}$, $Q_{npn2}$, which are connected in parallel with each other and the emitter layers of which are different from each other, and $Q_{pnp}$. With respect to these transistors $Q_{npn1}$, $Q_{npn2}$ and $Q_{pnp}$, the first MOSFET 12 connects the $n^-$-type base layer 3 as the collector of the transistor $Q_{npn1}$ and the first emitter layer 51 via the p-type base layer 4, and injects electrons into the n-type base layer 3. On the other hand, the second MOSFET 13 connects the drain layer 6 and the second emitter layer 52, and extracts holes from the base layer 4.

When the first gate electrode 10 is set at a positive potential while the second gate electrode 11 is set at zero in potential or at a negative potential in the semiconductor device thus constructed, the surface of the p-type base layer 4 as the back gate of the first gate electrode 10 becomes an n-type inverted layer, whereby the emitter electrode 71, the n-type emitter layer 51 as the source, the n-type inverted layer beneath the first gate electrode 10 and the $n^-$-type base layer 3 as the drain are thus connected. Consequently, electrons are injected into the $n^-$-type base layer 3 as a drift region from the emitter electrode 71, and holes are also injected from the $p^+$-type collector layer 2 accordingly. This means the pnp-type transistor $Q_{pnp}$ is turned on. Further, as the hole current of the pnp-type transistor $Q_{pnp}$ becomes the base current of the transistors $Q_{npn1}$ and $Q_{npn2}$, the transistors $Q_{npn1}$ and $Q_{npn2}$ are turned on. In other words, the thyristor constituted by the $p^+$-type collector layer 2, the $n^-$-type base layer 3, the p-type base layer 4 and the $n^{30}$-type emitter layers 51 and 52 is turned on. This device thus comes to have a low resistance as the high concentration carriers are caused to exist in the device. Thus, the device becomes a power device with a low ON-voltage because it is kept in the thyristor state by setting the first gate electrode 10 at a high potential while that of the second gate electrode 11 is kept at a low potential.

When the potential of the second gate electrode 11 is rendered high while the potential of the first gate electrode 10 is kept high in this ON state, the second MOSFET 13 is also turned on and the surface of the p-type base layer 4 beneath the second gate electrode 11 is inverted to the n-type. As the holes in the p-type base layer 4 are converted into electrons in the short-circuiting electrode 8, the p-type base layer 4, the short-circuiting electrode 8, the $n^{30}$-type drain layer 6, the n-type inverted layer beneath the second gate electrode 11 and the $n^{30}$-type emitter layer 52 are made conductive. For this reason, the hole current injected from the p-type collector layer 2 is to electron current through the p-type base layer 4 and the short-circuiting electrode 8 and flows out into the emitter electrode 72. Therefore, the npn-type transistors $Q_{npn1}$ and $Q_{npn2}$ are turned off. As a result, the thyristor function is eliminated and there follows the transistor state in which only the pnp-type transistor $Q_{pnp}$ operates. This state is similar to the operating state of IGBT and equivalent to a state in which the density of carriers existing in the device has decreased. Thus, when the potential of the first gate electrode 10 is then made negative to turn off, the time required for sweeping out the carriers can shortened, so that the turn-off time can be shortened.

This semiconductor device features that it is capable of not only performing a high-speed switching operation at a low voltage but also processing a large latchup current in the transistor state by separating the main current passage in the thyristor state from that in the transistor state. Since its second emitter layer 52 functions as the cathode of the thyristor in the thyristor state of the device, the main current linearly flows from the portion beneath the second emitter layer 52 as the source region of the second MOSFET toward the p⁺-type collector layer 2. In the transistor state of the device, on the other hand, the majority carrier in the n-type base layer 3 passes through the first MOSFET and flows out toward the emitter electrode 71 connected to the first emitter layer 51 as the source region, whereas the minority carrier flows into the p-type base layer 4 from the first MOSFET side and flows out from the second emitter layer 52 toward the side of the emitter electrode 72 via a connection portion to the $n^{30}$-type drain layer 6 and the second MOSFET. Therefore, the main current passage in the thyristor state in the portion beneath the second emitter layer 52 as the source region of the second MOSFET, is not commonly used. In other words, the latchup is suppressed as the current passage in the transistor state remains to have a low resistance and a large current can thus be processed. Moreover, high stability is secured in the transistor state.

SUMMARY OF THE INVENTION

As set forth above, the semiconductor device disclosed in the parent application features that it is capable of high-speed switching at a low ON-voltage and suppressing latchup.

An object of the present invention is to provide a semiconductor device capable of further improving the foregoing features.

In order to accomplish the object above, a semiconductor device according to the present invention has a thyristor structure comprising a first semiconductor region of a first conductivity type, a second semiconductor region of a second conductivity type, a third semiconductor region of the first conductivity type and a fourth semiconductor region of the second conductivity type; a first MISFET capable of injecting majority carriers of the second semiconductor region from the fourth semiconductor region into the second semiconductor region; and a second MISFET capable of being turned on and off independently of the first MISFET and extracting majority carriers of the third semiconductor region from the third semiconductor region into the fourth semiconductor region, wherein the fourth semiconductor region is divided into the source region of the first MISFET and the source region of the second MISFET, the latter being formed in a portion isolated from the former, characterized in that the depth of the source region of the second MISFET is different from that of the drain region thereof. Alternatively, the depth of the source and drain regions of the second MISFET is greater than that of the source region of the first MISFET. According to a still another embodiment, there is formed a semiconductor region of the first conductivity type between one portion beneath the gate electrode of the first MISFET in the third semiconductor region and the other portion beneath the gate electrode of the second MISFET, the semiconductor region being deeper than the fourth semiconductor region but shallower than the third semiconductor region, the concentration of impurities in the semiconductor region being greater than that of impurities in the third semiconductor region.

The source and drain regions of the second MISFET are formed by diffusion with the gate as a mask. If both the regions are not formed simultaneously and if one of them is made deeper than the other or both of them are made deeper than the source region of the first MISFET, the channel length will be rendered further shorter with respect to the width of the gate of the second MISFET by lateral diffusion. It is thus possible to micronize the channel width of MISFET without scaling down the design rule and the ON-resistance of the second MISFET is reducible. Consequently, the latchup current and the turn-off speed can be increased.

Further, increasing the depth of the source region of the second MISFET is to narrow the fourth semiconductor region of the second conductivity type located in the upper portion of the thyristor structure through which the main current flows, that is, it is to narrow the base layer of the bipolar transistor comprising the source region of the second MISFET, the third semiconductor region of the first conductivity type and the second semiconductor region of the second conductivity type. Since the transistor $h_{FE}$ rises, the ON-voltage of the thyristor also rises.

When the semiconductor region with the concentration of impurities greater than that of impurities in the third semiconductor region is formed between one portion beneath the gate electrode of the first MISFET in the third semiconductor region and the other portion beneath the gate electrode of the second MISFET, the resistance in the outflow of the majority carriers in the second semiconductor region is further reduced, thus making it possible to increase the maximum current allowable in the transistor state. Moreover, the time required for the transfer from the thyristor state to the transistor state is reduced, and the turn-off time is reduced. Rendering the depth of this semiconductor region smaller than that of the third semiconductor region results in increasing the concentration of impurities on the surface of this region, thus strengthening the function of increasing the latchup current value at the time IGBT is operated. The latchup is caused by the operation of the bipolar transistor comprising the source region of the first MISFET of the second conductivity type as the fourth semiconductor region, the third semiconductor region of the first conductivity type and the second semiconductor region of the second conductivity type. The resistance of the portion beneath the fourth semiconductor region is reduced by forming the high-impurity-concentration region deeper than the fourth semiconductor region, and the voltage drop across the region is prevented, whereby the latchup current is increased as the bipolar transistor becomes difficult to operate.

DETAILED DESCRIPTION OF THE PREFERRED EMBODIMENTS

Figure 1:
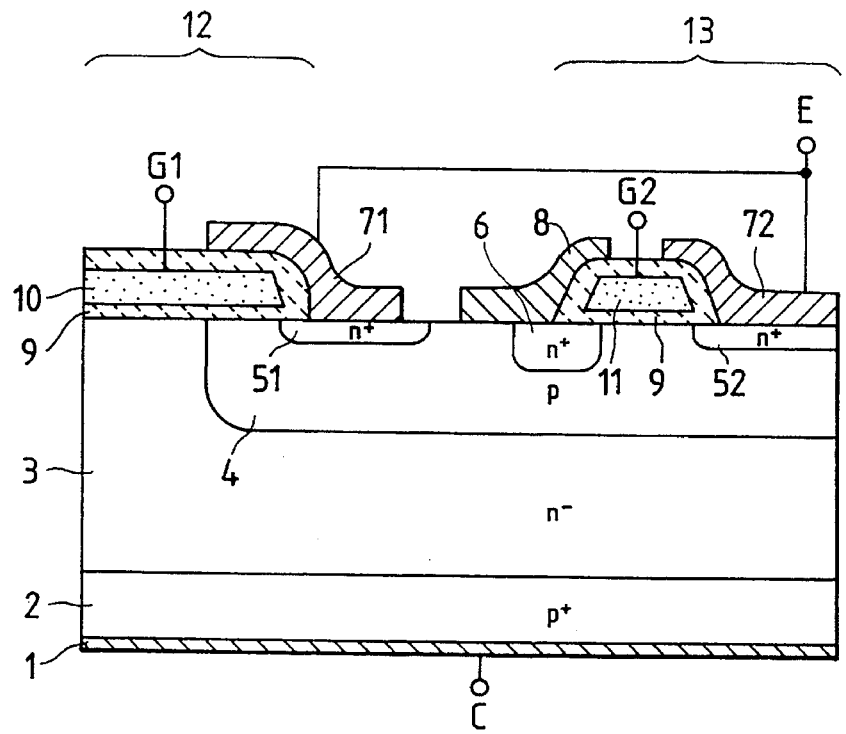
FIG. 1 is a sectional view of a semiconductor device according to an embodiment of the present invention.

Preferred embodiments of the present invention will be described with reference to the drawings in which like reference characters designate like or corresponding parts of FIG. 2.

Figure 2:
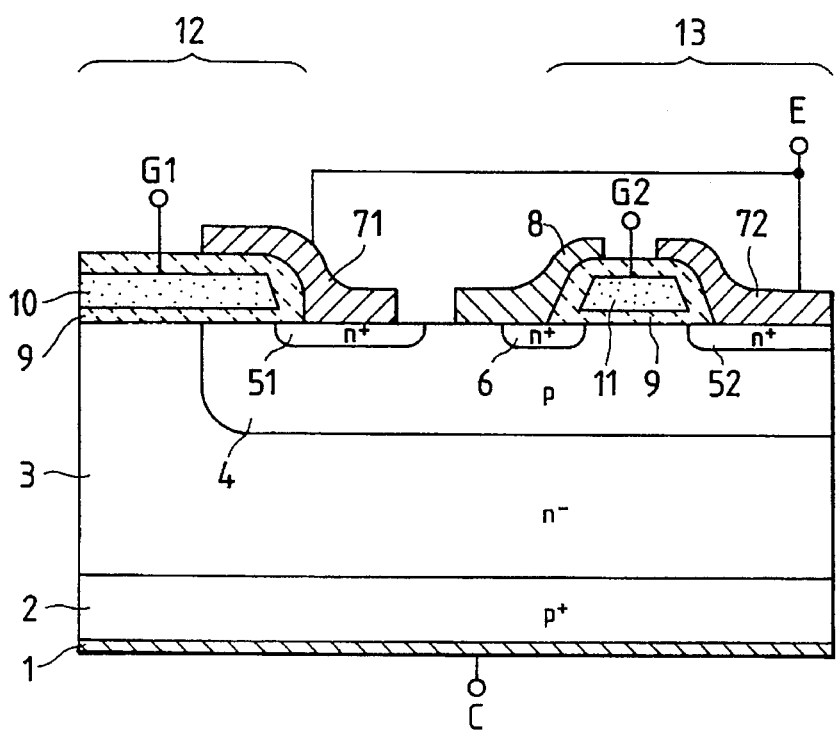
FIG. 2 is a sectional view of a semiconductor device before the present invention is applied.
Figure 3:
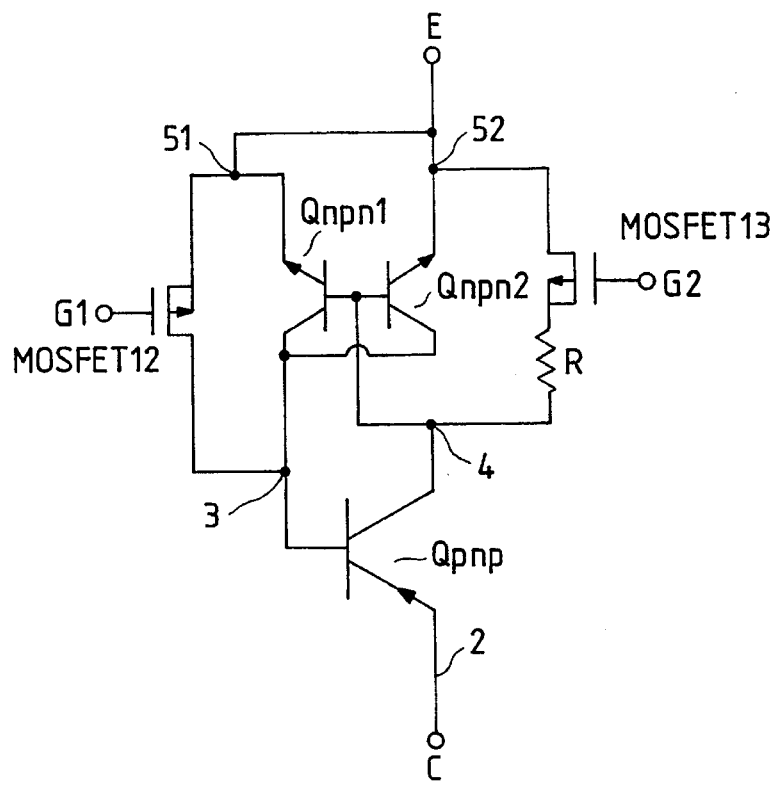
FIG. 3 is an equivalent circuit of the semiconductor device shown in FIG. 1 or 2.

In comparison with what is shown in FIG. 2, an $n^{30}$-type drain layer 6 in a double-gate semiconductor device of FIG. 1 is deeper, approximately 1 μm deep, than $n^+$ diffusion layers 51 and 52, which are approximately 0.3 μm deep. In other words, the channel length is made reducible further by increasing the diffusion depth of the diffusion layer on one side of a second MOSFET in comparison with the gate width (the width of a gate electrode 11) of the second MOSFET. Therefore, this technique employed herein makes it possible to micronize the channel width of MOSFET without scaling down the same design rule further in comparison with a method in which the source-drain diffusion layers of the second MOSFET are simultaneously formed. Thus, the ON-resistance of the second MOSFET can be reduced further; in other words, not only the latchup current but also the turn-off speed can be increased.

Figure 4:
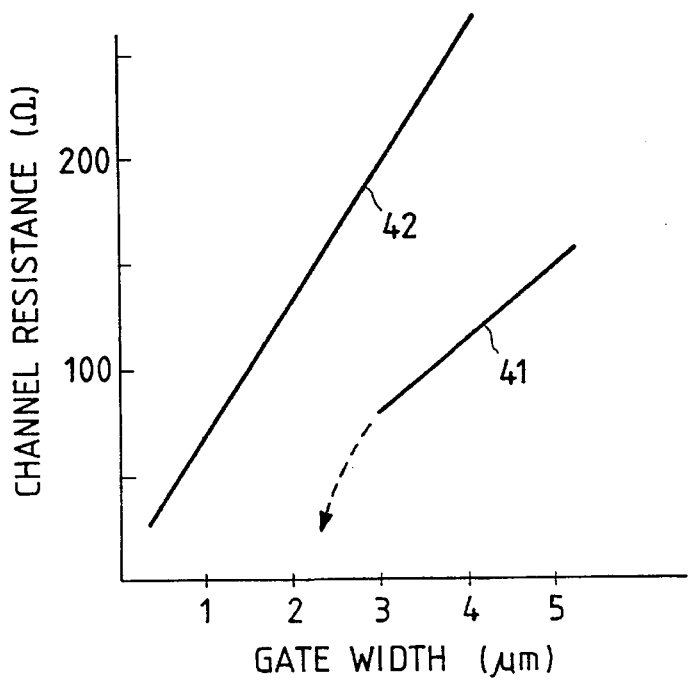
FIG. 4 is a diagram showing the relation between the gate width and channel resistance in MOSFET formed in the semiconductor devices shown in FIGS. 1 and 2.

FIG. 4 shows the relation between the gate width (the width of the gate electrode) of MOSFET and the channel resistance, wherein a line 41 refers to a case where as in the case of the second MOSFET according to the above embodiment of the invention, the source diffusion layer is approximately 0.3 μm deep and the drain diffusion layer is approximately 1 μm deep, whereas a line 42 refers to a case where as shown in FIG. 2, the source and drain diffusion layers are approximately and equally 0.3 μm deep. As is obvious from FIG. 4, the channel resistance of MOSFET whose gate width is 5 μm according to the present invention is seen to be substantially equal to that of MOSFET whose gate width is 2 μm according to the semiconductor device shown in FIG. 2. It is therefore possible to greatly reduce the ON-resistance of MOSFET according to the present invention without employing the micronization technique.

Figure 5:
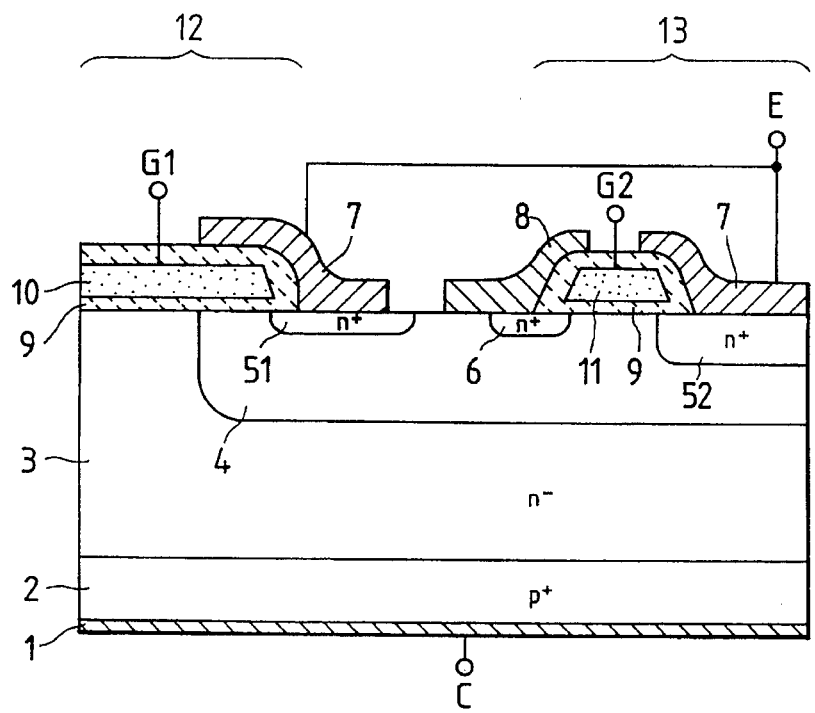
FIG. 5 is a sectional view of a semiconductor device according to another embodiment of the present invention.
Figure 7:
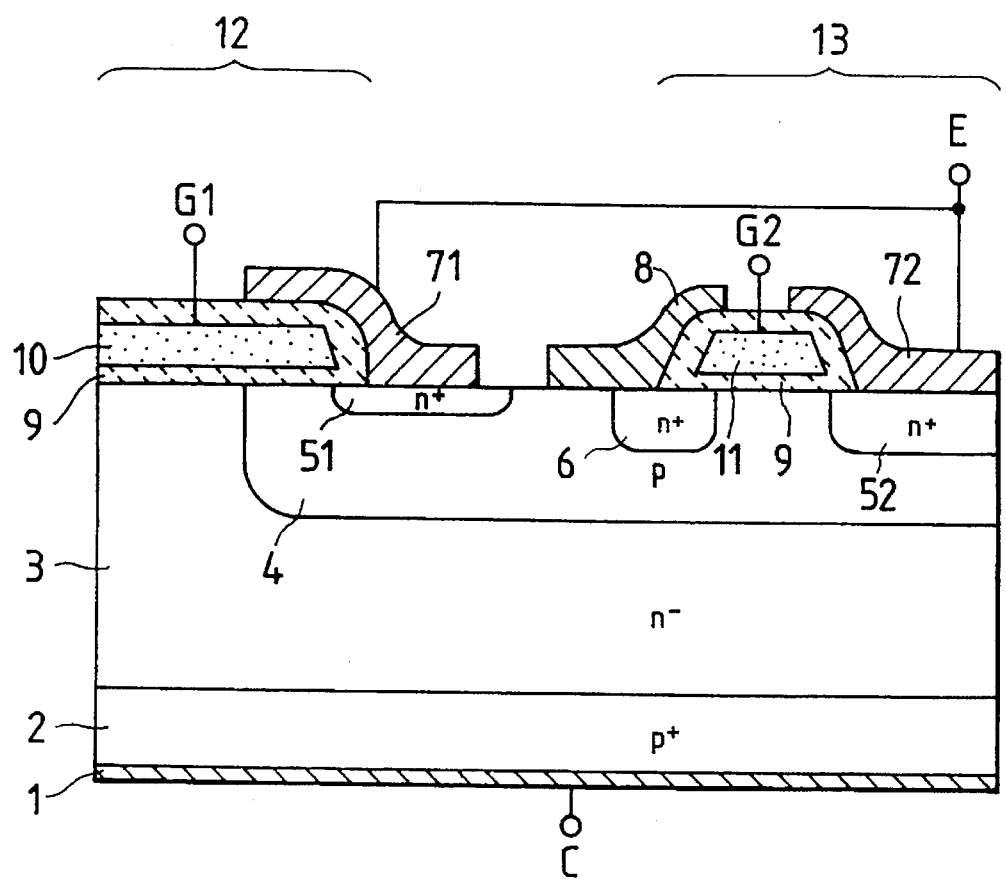
FIG. 7 is a sectional view of a semiconductor device according to a yet another embodiment of the present invention.

This effect is also achievable in another embodiment of the present invention as shown in FIG. 5, wherein the drain layer 6 is formed simultaneously with the emitter layer 51 of a first MOSFET and wherein the emitter layer 52 of a second MOSFET is made deeper. Alternatively, the diffusion depth of both the drain layer 6 and the emitter layer 52 may be increased as shown in FIG. 7.

Further, increasing the diffusion depth of the source layer of the second MOSFET also has the effect of decreasing the ON-voltage when the thyristor is operated. The main current is kept flowing through an npnp thyristor comprising the emitter layer 51, the p-type base layer 4, the n-type base layer 3 and the p-type collector layer 2 when the thyristor is operated. Consequently, $h_{FE}$ of the upper npn transistor is caused to rise by increasing the depth of the source diffusion layer of the second MOSFET, that is, the ON-voltage of the thyristor becomes reducible.

Figure 6:
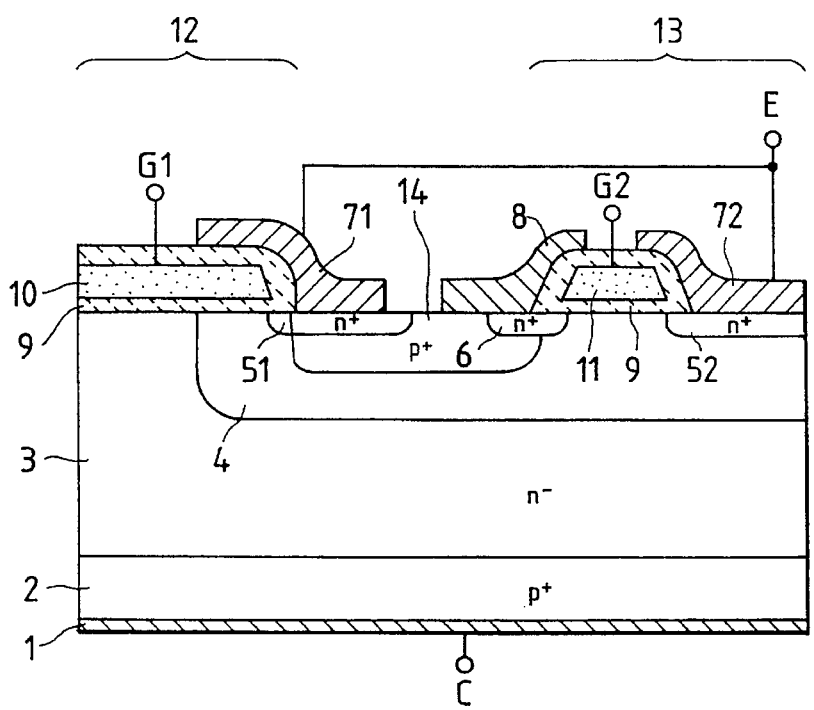
FIG. 6 is a sectional view of a semiconductor device according to a still another embodiment of the present invention.

FIG. 6 shows a still another embodiment of the present invention, wherein a high-concentration p-type diffusion layer 14 is additionally provided inside the p-type base layer 4. The diffusion depth of the p-type diffusion layer 14 is preferably less than that of the p-type base layer 4 and greater than that of the n-type emitter layer 51. With the formation of the diffusion layer 14, the current value latched up at the time IGBT is operated can be increased. In other words, the latchup is caused by the operation of an npn bipolar transistor comprising the n-type emitter layer 51, the p-type base layer 4 and the n-type base layer 3. With the provision of the p-type diffusion layer 14, there develops a decrease in the resistance of the portion beneath the emitter layer 51 for use as a passage through which the hole current passes when IGBT is operated, whereby a voltage drop in the p-type diffusion layers 4 and 14 is prevented. Therefore, the base layer of the npn transistor hardly becomes biased in the forward direction and the value of the current to be latched up can be increased at the time IGBT is operated. In other words, a large controllable current can be secured.

The present invention is not limited to the foregoing embodiments but may be implemented in combination with the embodiments dislcosed in the parent application.

As set forth above, a controllable current can be increased as the ON-resistance of the second MISFET through which the main current flows in the ON state, is made reducible by making greater the diffusion depth of both or one of the source-drain regions of the second MISFET in the double-gate-type semiconductor device as in the parent application than that of the source region of the first MISFET. Further, switching loss is also reducible as the ON-voltage is reducible when the thyristor is operated.

Moreover, the formation of a high-concentration impurity semiconductor region which is effective in decreasing the resistance of the source region of the first MISFET may result in increasing not only the latched up current value but also the controllable current.

What is claimed is:

1. A semiconductor device, comprising:

a first semiconductor region of a first conductivity type;

a second semiconductor region of a second conductivity type formed on said first semiconductor region;

a third semiconductor region of the first conductivity type formed on said second semiconductor region;

a fourth semiconductor region of the second conductivity type formed in said third semiconductor region, said first, second, third and fourth semiconductor regions constituting a thyristor structure;

a first MISFET for injecting majority carriers from a first sub-region of said fourth semiconductor region into said second semiconductor region; and a second MISFET being turned on and off independently of said first MISFET and extracting majority carriers from said third semiconductor region into a second sub-region of said fourth semiconductor region, said fourth semiconductor region being divided into a first source region, corresponding to the first sub-region, of said first MISFET, a second source region, corresponding to the second sub-region, of said second MISFET electrically connected with said first source region via respective source electrodes, and a drain region of said second MISFET located between said first and second source regions, said first source region being isolated from said drain region, and said drain region electrically connected to said third semiconductor region by a shorting electrode;

wherein a depth of said second source region of said second MISFET is different from that of said drain region of said second MISFET.

2. A semiconductor device, comprising:

a first semiconductor region of a first conductivity type;

a second semiconductor region of a second conductivity type formed on said first semiconductor region;

a third semiconductor region of the first conductivity type formed on said second semiconductor region;

a fourth semiconductor region of the second conductivity type formed in said third semiconductor region, said first, second, third and fourth semiconductor regions constituting a thyristor structure;

a first MISFET for injecting majority carriers from a first sub-region of said fourth semiconductor region into said second semiconductor region; and a second MISFET being turned on and off independently of said first MISFET and extracting majority carriers from said third semiconductor region into a second sub-region of said fourth semiconductor region, said fourth semiconductor region being divided into a first source region, corresponding to the first sub-region, of said first MISFET, a second source region, corresponding to the second sub-region, of said second MISFET electrically connected with said first source region via respective source electrodes, and a drain region of said second MISFET located between said first and second source regions, said first source region being isolated from said drain region, said drain region electrically connected to said third semiconductor region by a shorting electrode;

wherein depths of said second source region and said drain region of said second MISFET are greater than a depth of said first source region of said first MISFET.

3. A semiconductor device comprising:

a first semiconductor region of a first conductivity type;

a second semiconductor region of a second conductivity type formed on said first semiconductor region;

a third semiconductor region of the first conductivity type formed on said second semiconductor region;

a fourth semiconductor region of the second conductivity type formed in said third semiconductor region, said first, second, third and fourth semiconductor regions constituting a thyristor structure;

a first MISFET for injecting majority carriers from a first sub-region of said fourth semiconductor region into said second semiconductor region;

a second MISFET being turned on and off independently of said first MISFET and extracting majority carriers from said third semiconductor region into a second sub-region of said fourth semiconductor region, said fourth semiconductor region being divided into a first source region, corresponding to the first sub-region, of said first MISFET, a second source region, corresponding to the second sub-region, of said second MISFET electrically connected with said first source region via respective source electrodes, and a drain region located between said first and second source regions, said first source region being isolated from said drain region, and said drain region electrically connected to said third semiconductor region by a shorting electrode; and a fifth semiconductor region of the first conductivity type formed in said third semiconductor region and extending between a first gate electrode of said first MISFET and a second gate electrode of said second MISFET, said fifth semiconductor region being deeper than said fourth semiconductor region but shallower than said third semiconductor region, a concentration of impurities in said fifth semiconductor region being greater than a concentration of impurities in said third semiconductor region.

\* \* \* \* \*